United States Patent [19]

Agrawal et al.

[11] Patent Number: 4,771,285

[45] Date of Patent: Sep. 13, 1988

[54] PROGRAMMABLE LOGIC CELL WITH FLEXIBLE CLOCKING AND FLEXIBLE FEEDBACK

[75] Inventors: Om Agrawal; Kapil Shankar; Fares N. Mubarak, all of San Jose, Calif.

[73] Assignee: Advanced Micro Devices, Inc., Sunnyvale, Calif.

[21] Appl. No.: 795,159

[22] Filed: Nov. 5, 1985

[51] Int. Cl.[4] .................. H04Q 1/00; G06F 7/38; H03K 19/173

[52] U.S. Cl. .................. 340/825.83; 307/465; 340/825.84

[58] Field of Search .................. 340/825.79, 825.83, 340/825.84, 825.85, 825.86; 307/465, 468, 466

[56] References Cited

U.S. PATENT DOCUMENTS

| | | | |
|---|---|---|---|
| 4,307,379 | 12/1981 | Wyland | 340/825.83 |
| 4,415,818 | 11/1983 | Ogawa et al. | 340/825.83 |
| 4,433,331 | 2/1984 | Kollaritsch | 340/825.83 |
| 4,458,163 | 7/1984 | Wheeler et al. | 307/466 |
| 4,479,126 | 10/1984 | Higuchi et al. | 340/825.86 |
| 4,562,427 | 12/1985 | Ecton | 307/465 |
| 4,612,459 | 9/1986 | Pollachek | 307/468 |
| 4,684,826 | 8/1987 | France et al. | 307/466 X |
| 4,684,830 | 8/1987 | Tsui et al. | 307/465 |

OTHER PUBLICATIONS

*Advanced Micro Devices 24-pin IMOX TM Programmable Array Logic Device;* Advanced Micro Devices, Inc.; Sunnyvale, California; Jun. 1983.

*Primary Examiner*—Robert L. Griffin
*Assistant Examiner*—Ralph E. Smith
*Attorney, Agent, or Firm*—Mark A. Haynes

[57] ABSTRACT

A logic circuit communicating to and from an input-/output port in a variety of input modes and in a variety of output modes. The circuit may be configured to have a dedicated, registered, or latched input; and in the output mode to have a registered, combinatorial or latched output. A register/latch, in conjunction with a programmable input select multiplexer, can function as an input, output or buried register or as a transparent latch. A programmable clock select multiplexer selects between a clock/latch enable signal applied at an external pin or a product term generated internally. Clock polarity control is also provided. Asynchronous reset and preset of the register/latch is provided along with polarity control therefor. Dedicated and programmable feedback paths are provided. An output inverter can selectably be enabled from internal signals or from an external pin. The logic circuit can be deployed in banks, each bank electably receiving the same or a different clock. The register/latch can be preloaded via an internally-generated signal or from the external pins.

74 Claims, 3 Drawing Sheets

PROGRAMMABLE LOGIC CELL WITH FLEXIBLE CLOCKING AND FLEXIBLE FEEDBACK

FIELD OF THE INVENTION

The present invention relates to integrated circuit chips, and more particularly, to circuits for controlling signals communicating to and from an input/output port on an integrated circuit chip, especially one containing a programmable array logic device.

BACKGROUND OF THE INVENTION

As the technology for manufacuring integrated circuits progresses, it is becoming possible to put more and more discrete logic components on a single integrated circuit chip. For instance, there can be thousands of discrete logic components, such as, AND-gates, OR-gates, inverters and registers, on a single integrated circuit chip. However, due to limitations in packaging technology, the number of input and output ports to a given integrated circuit chip is limited. Thus, thousands of discrete logic components must be served typically by on the order of a few dozen input/output (I/O) ports. The small number of input/output ports available for a given integrated circuit thus severely restricts the flexibility in design of logic circuits implemented on integrated circuit chips.

Flexibility in design in particularly important for devices such as programmable array logic devices. In a programmable array logic device, a user of the device configures the logic array according to a specific need using field programming techniques. Since the user is constrained in his design choices by the configuration of the input/output pins, the utility of the programmable logic array is limited.

A prior U.S. patent application owned by the assignee in common with the present application, entitled APPARATUS FOR PRODUCING ANY ONE OF A PLURALITY OF SIGNALS AT A SINGLE OUTPUT, Ser. No. 433,253, filing date Oct. 7, 1982, addresses one way in which the configuration of input/output ports may be made more flexible. There, the user is able to select one of two types of output signals for a given output pin by setting a selector means using field programming techniques, such as blowing a fuse or not blowing the fuse, when the designer sets up the logic circuit on the chip. Thus, for example, the designer is able to locate registered outputs and combinatorial outputs on the I/O pins as he desires for a selected logic array package.

Another way in which to increase the flexibility of the design for programmable array logic devices of the prior art provides selectable feedback in the output logic so that the designer may choose using field programming techniques to provide a feedback path directly from the I/O pin to the logic array, in effect, treating the I/O pin as an input pin, or to select a registered output from the logic array as feedback. This sort of feedback system is described in product literature for the Advanced Micro Devices 24-pin IMOX TM Programmable Array Logic Device designated the AmPAL22V10 (PAL is a registered trademark of Monolithic Memories, Inc.). An advanced information sheet concerning the AMPAL22V10 was released by Advanced Micro Devices, Inc., Sunnyvale, Calif. dated June, 1983. This advanced information can be referred to for further background to the present invention.

Both the output selector and the feedback selector of the prior art mentioned above involved a designed-in or field programmed selection of the type of feedback or the type of output for a particular I/O pin. Accordingly, the user was limited to one configuration of each I/O pin for the device. Since it is desirable to provide a flexible output logic circuit, there is a need for an output logic circuit which provides for increased flexibility and overcomes the limitations of the prior art.

In addition, while the user could configure each I/O pin as an output logic circuit in the prior art, it is very often desirable to configure an I/O pin also as an input logic circuit. Furthermore, because of the use of such logic circuits in sequencers which employ internal state counters, it is often desirable to deploy a register within the logic circuit as an input, output or buried state register or alternatively as an input or output transparent latch. Accordingly, there is need for an input/output circuit which can be flexibly configured in either an input or an output mode and in which a register/latch can be flexibly utilized. A need for control of the feedback to the logic array, control over enabling of the output signal and flexibility in the manner of preloading, resetting and presetting of the register are recognized as desirable features missing from output logic circuits.

Furthermore, it is often desirable to allow clocking of the register/latch of individual output logic circuits from the logic array as well as from the usual clock, with selection by the user. It may even be desirable to permit user-selection from a pair of clocks, particularly when the integrated circuit chips employing the output logic circuits are deployed in two banks, each with its own clock.

SUMMARY OF THE INVENTION

The present invention includes an input/output (I/O) cell for controlling the configuration of an input/output port which allows for dynamic control of the configuration and increases the flexibility of design for the user of the invention. The configuration of the input/output cell is dynamically controlled by the user by coordinating various signals generated by a programmable array logic device, in conjunction with various field-programmable fuses within the I/O cell of the present invention.

An input/output logic device for controlling configuration of an input/output port of an integrated circuit is provided. The input/output logic device receives a first logic signal from the internal logic of the integrated circuit. A fuse-programmable register/latch, responsive to a clock/latch enable signal, for latching the logic signal to provide a registered signal is included in the I/O logic device. A fuse-programmable output select multiplexer receives both the logic signal and the registered signal and selects, responsive also to an output select signal, either the first logic signal or the registered signal as output from the output logic means. A fuse-programmable input select multiplexer receives both the first logic signal and a first feedback signal and can alternatively apply the first feedback signal to the register/latch. An input select control signal permits selection of the signal to be applied to the register/latch and also permits selection of preloading of the register/latch by a signal generated by the internal logic or by a signal applied externally.

A dedicated feedback path conducts the first feedback signal to the internal logic of the integrated circuit. Another feedback path conducts a second feedback signal to the internal logic of the integrated circuit. A fuse-programmable feedback select multiplexer, selects either the first logic signal or the registered/latched signal as the second feedback signal to the internal logic. Further, a fuse-programmable clock select multiplexer responsive to a clock signal and a second logic signal selects the clock signal to clock the register or enable the latch. Accordingly, the register/latch, the input select multiplexer, the output select multiplexer, the feedback multiplexer, and the clock select multiplexer are controllable by a combination of their respective programmable fuses and dynamic control signals.

Further flexibility and dynamic control is attained in a preferred embodiment with an output inverting buffer, responsive to an output enable signal, for providing the signal selected from the output select multiplexer as an output signal to an I/O port on the integrated circuit package. Also, multiplexer means for dynamically providing the output enable signal are included which permit selection of the source of the output enable signal from either the internal logic or an external pin of the integrated circuit.

Other means for providing flexibility and dynamic control include means for dynamically providing asynchronous reset or preset signals to the register/latch. Further, the I/O port may be configured to provide to the internal logic of the integrated circuit input independent from the feedback means. Means are also included for programming register clock/latch enable polarity, output enable polarity, and asynchronous reset and preset polarity.

Means for dynamically providing the output enable signal, means for dynamically providing the asynchronous reset and preset signals, means for dynamically providing the second logic clock signal and means for providing the reset and preset signals are included in the present invention.

The I/O cell of the present invention can be configured to present a variety of input architectures at its I/O port and a variety of output architectures at its I/O port. Dedicated input, registered input, or latched input can be provided, and in the case of dedicated input, the register/latch can also be used as a buried state register. In its output mode, the cell can provide registered output, combinatorial output, and latched output. The register/latch in conjunction with a fuse-programmable input select multiplexer can be used for input, output or as a buried register, the multiplexer selecting between signals supplied by the internal logic or the I/O pin; in the former case the register/latch operating as an output register, in the latter case, the I/O cell provides registered input to the internal logic. This feature of the I/O cell being very useful for synchronizing asynchronous input signals.

The register/latch is fuse-programmable to perform as a transparent latch. When the I/O cell is configured as an output cell, this provides latched output. When the cell is configured as an input cell with signals applied at the I/O pin, the cell provides latched input. A fuse-programmable clock select multiplexer selects between a clock/latch enable signal applied at the I/O pin or a product term signal generated by the internal logic. The clock/latch enable signal being applied to the register/latch and functioning as a clock signal if the cell is configured to act as a register and as a latch enable if the cell is configured to act as a latch. In addition, there is polarity control for the clock/latch enable signal which permits clocking the register on the rising or falling edge of the clock signal and enabling the latch with active HIGH or active LOW latch enable signals. Each asynchronous reset and preset product term also has a polarity control which allows an active HIGH or active LOW reset capability. Means are provided for selection of a source, either from the logic internal to the chip, or from external pins of the chip to preload the register/latch.

While an exemplary embodiment of the invention is given in terms of field-programmable fuses, the alternative use of CMOS, EPROM and $E^2PROM$ memory cells as equivalents to the fuses is developed.

Multiplexer means are provided to allow clocking of the register/latch of individual output logic circuits from the logic array as well as from the usual clock, with selection by the user. In an exemplary embodiment this feature is used to permit user-selection from a pair of clocks, when the input/output logic circuits of the present invention are deployed in two banks, each with its own clock. Means are also provided to permit user selection of clock polarity.

DETAILED DESCRIPTION OF THE PREFERRED EMBODIMENT

Figure 1:
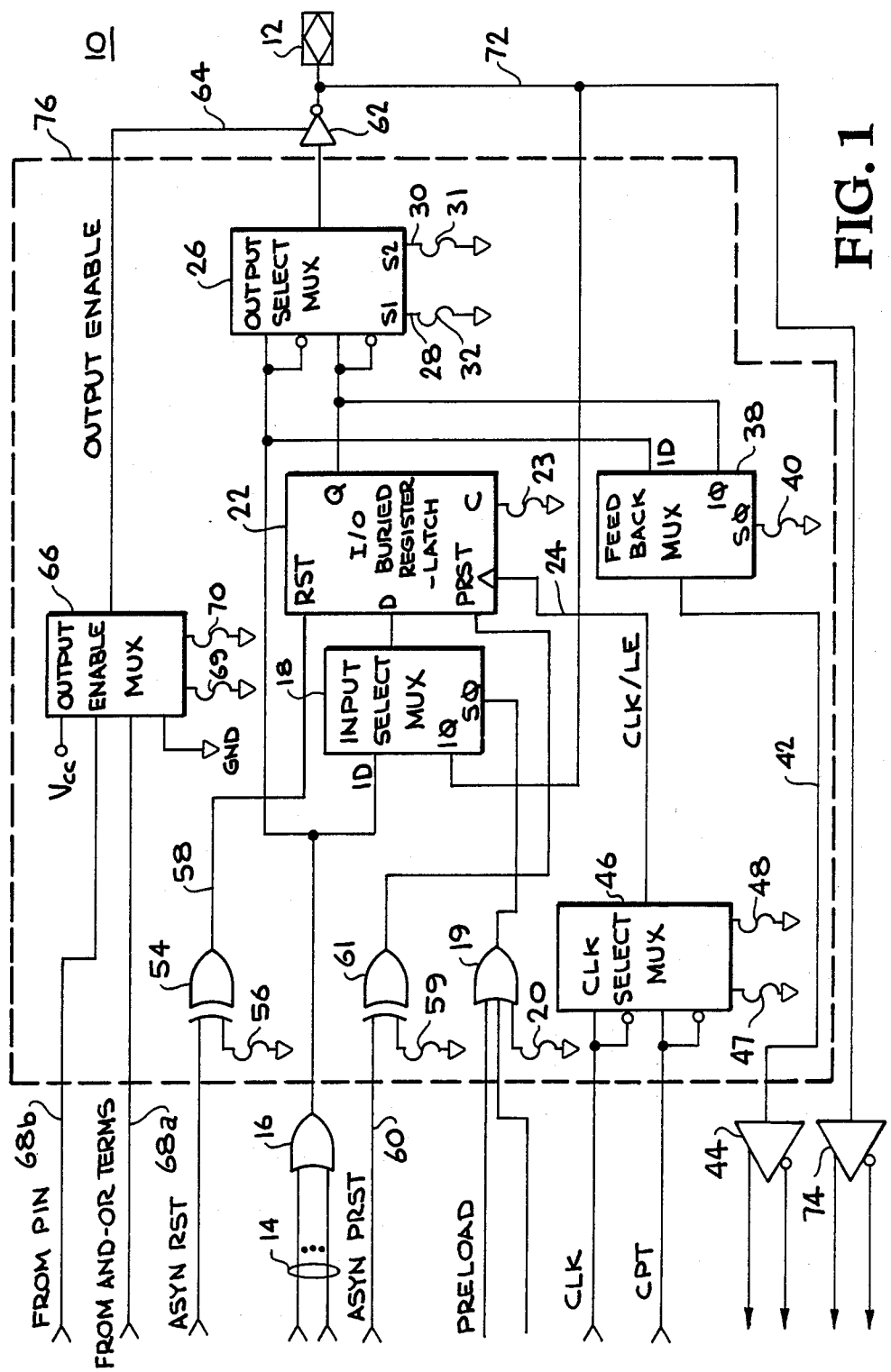
FIG. 1 is a logic diagram of a preferred embodiment of the present invention.

FIG. 1 is a logic diagram of the fuse-programmable input/output cell 10 of the present invention. The cell 10 as shown in FIG. 1 controls configuration of an input/output port of an integrated circuit chip, such as an I/O pin 12.

The input/output cell 10 is connected to a programmable array logic (PAL) device, such as a programmable AND array, which generates logic signals on a set of lines 14. The construction of the programmable AND array is discussed in more detail below. As appreciated in the art, other means for dynamically providing the control signals in this invention can be used, such as a combination of logic signals from a plurality of programmable AND arrays.

Various signals, called "product terms", are conducted on lines 14 to an OR gate 16. Further description of these so-called "product terms" is also contained hereinafter. OR gate 16 is connected to a first (1D) input of a two input/one output fuse-programmable input select multiplexer (MUX) 18. MUX 18 receives at a control select input (S0 a signal which determines which of the signals applied to MUX 18 at its 1D and 10 input terminals will be generated at an output terminal of MUX 18.

An OR gate 19 receives at a first input a preload control signal as a product term generated by the programmable AND array and field-programmable fuse 20 is connected to a second input of OR gate 19. A signal conducted from an external terminal (pin) of the integrated circuit chip is applied to a third input of OR gate 19. The signal generated at the output of OR gate 19 is conducted to the control select input (S0) of MUX 18.

Each field-programmable fuse circuit includes a resistor (not shown) connected to a high potential $V_{cc}$. In parallel with the resistor is a fuse connected to ground. The fuse is a field programmable fuse which may be blown or not blown as the user desires when he sets up the device to choose various features such as input selection and clock polarity. Means for dynamically providing control signals can be implemented, instead of by the static field-programmable input, by the product terms generated by programmable AND arrays, a combination of programmable AND arrays, or the like. Further, it will be appreciated by those skilled in the art that the control signals determined by the state elements shown in the figures, and described herein, as field-programmable fuses, may be alternatively provided by CMOS, EPROM or E²PROM memory elements or by signals applied to external pins of the integrated circuit.

The output terminal of MUX 18 is connected to the data input (D) of a fuse-programmable output, input or buried D-type register/latch 22. Register 22 is programmable by a field-programmable register/latch fuse 23 to function as either a transparent latch or as an output, input or buried register, depending on the state of fuse 23 connected to a control (C) input of register 22. Responsive to a clock/latch enable (CLK/LE) signal on line 24, the register/latch 22 either latches the logic signal received from MUX 18 or generates a registered signal at a Q output terminal, depending on the state of fuse 23. Alternatively, the state of register/latch 22 may be set by application of the preload control signal received from the programmable AND array or from the external pin chosen in conjunction with the state of fuse 20.

The input/output cell 10 shown in FIG. 1 further includes an output select 4 to 1 multiplexer 26, which receives the signal generated by register/latch 22 at a first true and at a first complemented input terminal and the signal generated by OR gate 16 at a second true and at a second complemented input terminal.

The output select multiplexer (MUX) 26 generates at an output terminal either the signal generated at the output of D flip-flop 22, its complement, the logic signal generated by OR gate 16, or its complement, depending on the state of the signals applied to output select inputs $S_1$, $S_2$, as provided over lines 28 and 30 respectively. A pair of field-programmable fuses 31 and 32 are connected to lines 28 and 30, respectively, which determine the state of the output select signal applied to input $S_1$ and $S_2$, respectively. The fuse 31 connected to input $S_1$ determining the "output selection", and fuse 32 connected to input $S_2$ determining the "output polarity".

Included in the fuse-programmable input/output cell 10 of FIG. 1 is a fuse-programmable two input/one output feedback multiplexer (MUX) 38. The feedback MUX 38 receives at a 1D input terminal the logic signal generated by the OR gate 16. MUX 38 receives at a 10 input terminal the signal generated at the output terminal of register/latch 22.

The feedback MUX 38 generates at its output terminal one of the signals applied to its 1D or 10 terminals as controlled by the field-programmable fuse 40 connected to a control select input (S0) of MUX 38. Thus in response to a feedback select control signal applied to the S0 terminal, the feedback MUX 38 selects from the signals applied to its 1D or 10 input terminals to generate a feedback signal on line 52. The feedback signal on line 42 is conducted to an input buffer such as the true and complement buffer 44 for feedback to the logic circuits internal to the integrated circuit.

The input/output cell 10 shown in FIG. 1 further includes a four-input, one-output programmable clock signal select multiplexer (CLK SELECT MUX) 46 which receives at a true and at a complemented input terminal the clock (CLK) signal at a true and at a complemented input terminal an independent clocking product term for generating a clock/latch enable (CLK/LE) signal on line 24 which is received at a clock input of register/latch 22. A clock means (not shown) provides the clock signal CLK and the programmable AND array (not shown) provides the product term (CPT). A pair of field-programmable fuses 47 and 48 is connected to the control select inputs of MUX 46, the state of which determines the signal applied at the inputs to MUX 46 which will be generated at the output of the CLK SELECT MUX 46.

The independent clocking product term (CPT) produces a clock/latch enable signal CLK/LE on line 24 by a means for dynamically providing the clocking product term. As shown in FIG. 1, this may be accomplished using the programmable AND array (not shown) or other logic circuits.

An additional feature of the preferred embodiment shown in FIG. 1 includes dynamically providing an independent asynchronous reset (ASYN RST) signal to a reset (RST) input terminal of the register/latch 22. This is accomplished in FIG. 1 by the programmable AND array or by other logic circuitry. A polarity-controlling XOR gate 54 receives the ASYN RST signal at a first input terminal and a field-programmable fuse 56 is connected to a second input of XOR gate 54. By using this field programming technique, the polarity of the ASYN RST signal can be controlled. A polarity-controlled asynchronous reset signal (AR) is generated at the output of gate 54 and conducted to the reset (RST) terminal of register/latch 22. The asynchronous reset signal will cause the register/latch 22 to generate a logic ZERO output signal at its Q output terminal when the asynchronous reset signal ASYN RST goes HIGH. This switching occurs independent of the CLK/LE signal applied to register/latch 22. The asynchronous reset signal AR is received over line 58 by the register/latch 22.

The register/latch 22 also receives an independent asynchronous preset (ASYN PRST) signal conducted to its preset (P) terminal over line 60. A polarity-controlling XOR gate 61 receives the ASYN PRST signal at a first input terminal and a field-programmale fuse 59 is connected to a second input of XOR gate 61. By using this field-programming technique, the polarity of the ASYN PRST signal can be controlled. A polarity-controlled asynchronous preset signal (AP) is generated at the output of gate 61 and conducted to a preset (PRST) terminal of resister/latch 22. When the asynchronous preset signal is set, the signal generated at the Q output of the register latch 22 is set to a HIGH signal when clocked by the CLK/LE signal received by register/latch 22. Means providing the asynchronous preset signal ASYN PRST or asynchronous reset signal ASYN RST are not shown in FIG. 1, but can be implemented dynamically using various product terms generated by the programmable AND array or the like.

The input/output cell 10 of FIG. 1 also includes an output inverting buffer 62 which receives the output signal generated by the output select MUX 26. The output inverting buffer 62 is enabled by an output enable signal received on line 64. Means for dynamically providing the output enable signal on line 64 are also included. As shown in FIG. 1, a products term provided by the programmable AND array is provided to an input of a programmable four-input, one-output output enable multiplexer (MUX) 66 on line 68a. MUX 66 also receives, at a second input, an output enable signal from an external pin of the integrated circuit chip via signal line 68b. MUX 66 also receives at a third and fourth inputs a high potential $V_{cc}$ and a ground potential Gnd, respectively. A pair of field-programmable fuses 69 and 70 is connected to a pair of ouput select inputs of MUX 66, which determine the signal generated at the output of MUX 66. The output enable signal generated by MUX 66 is conducted to buffer 62 via signal line 64. The signal generated by buffer 62 is conducted to I/O pin 12, to the 10 input terminal of INPUT SELECT MUX 18 and via a feedback circuit path 72 from the I/O pin 12 directly to a true and complement buffer 74. The signals generated at the output terminals of buffer 74 are conducted to the circuits internal to the chip.

As mention earlier, the control of any of the circuit elements shown on FIG. 1 by means of the programmable fuses 20, 31, 32, 40, 56, 59, 69 and 70 can be alternately provided by product terms generated by the circuits internal to the integrated circuit chip containing circuit 10. Another alternative is to control any of these elements by signal applied to the external terminals (pins) of the integrated circuit chip, as will be appreciated by those skilled in the art. To simplify the description of the circuits shown in FIG. 2, the portions of the input/output cell 10 within the dashed line 76 are termed the input/output (I/O) logic macrocell 78.

Figure 2:
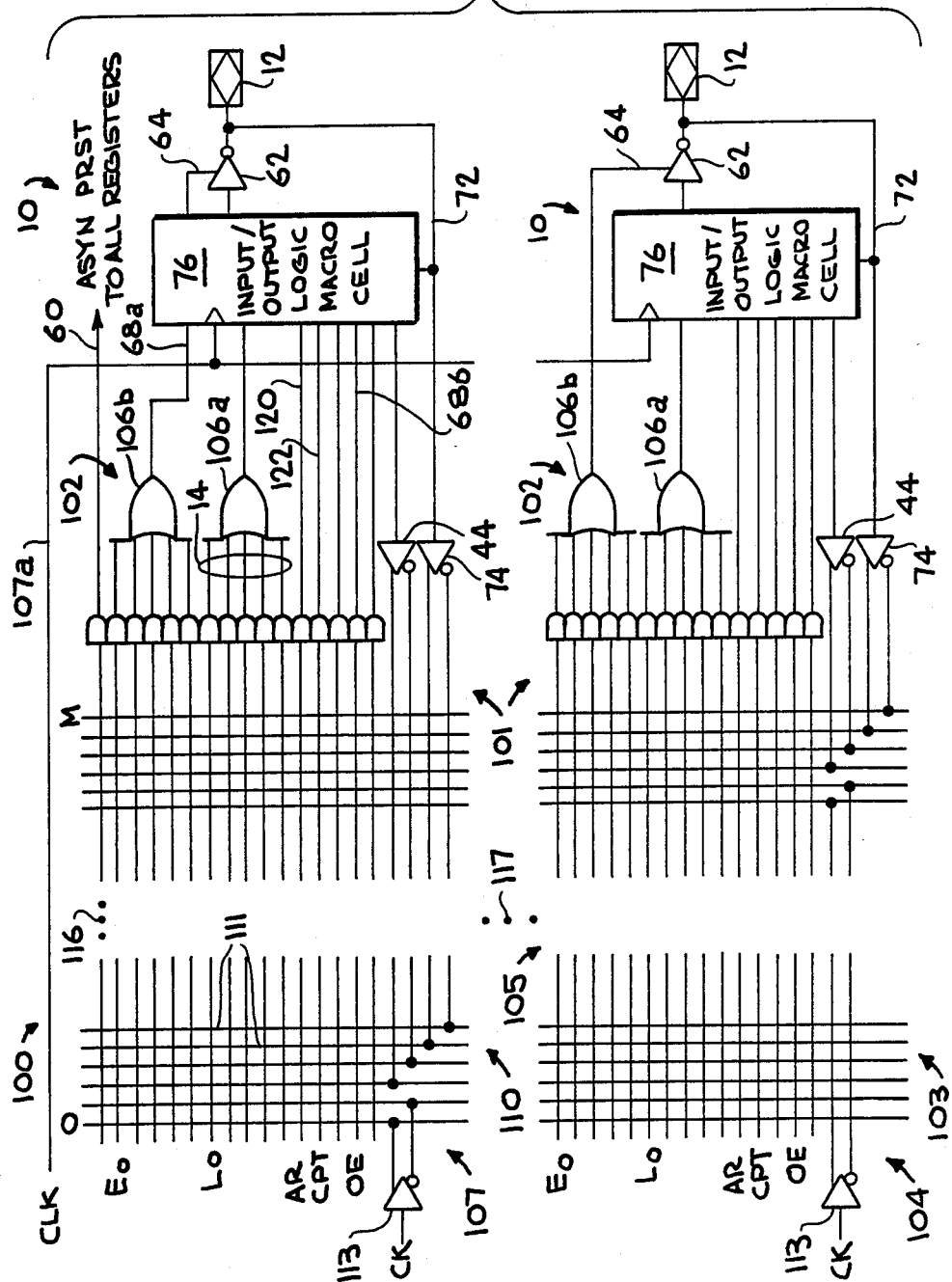
FIG. 2 is a schematic diagram of a programmable array logic device implementing the present invention.

In order to more clearly discuss the function of the input/output cell 10 of the present invention, FIG. 2 depicts an implementation of the present invention in a programmable array logic (PAL) device 100. The programmable array logic (PAL) device 100 shown in FIG. 2 is constructed using the sum of products scheme familiar to those skilled in the art, although other combinations of logic cells can be used. Accordingly there are a plurality of multiple input programmable AND arrays 101 formed on the device. The AND arrays 101 provide what is known as a "product term" which is summed using the plurality of multiple input OR-gates 102. Accordingly, the output of each of the OR-gates 102 is a "sum-of-products term". Reference can be had to "Programmable Array Logic Handbook" copyright 1984, Advanced Micro Devices, Inc. for further details of the internal construction of PALs.

Figure 3:
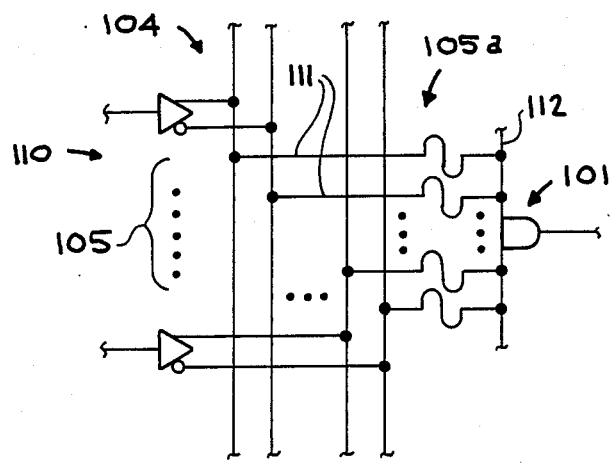
FIG. 3 is a diagram of a logic equivalent of a programmable AND array, a plurality of which are depicted schematically in FIGS. 1 and 2.

The diagram of FIG. 2 schemically shows the programmable AND arrays using a grid 110 of lines. FIG. 3 is used to illustrate the logical equivalent of the grid 110. Each of the vertical lines 103 in FIG. 2 represents an input signal 104 or one of the feedback signals from the true and complement buffers 44, 74. Each of the horizontal lines 105 shown in FIG. 2 represents a plurality of inputs, one for each intersection 111 of lines to the programmable AND array 101. As illustrated in FIG. 3, each intersection 111 of a vertical line with a horizontal line is depicted as a fuseable link 105a between one of the vertical lines 103 and one of the multiple inputs 112 to the programmable AND array 101. The programmable AND array 101 is field programmable using well knwon fuse programming techniques for selecting the inputs controlling the product term of the particular programmable AND array 101.

As can be seen in FIG. 2, each of the input signals are provided through buffers such as a true and complement buffer 113 to the input lines 104. Each of the input signals and feedback signals from the true and complement buffers 113, 44, 74 can be linked through a programmable link to any of the programmable AND arrays 101 on the programmable array logic device. Thus the programmable array logic device 100 is configurable by the user to accomplish a wide variety of logic tasks. The output logic circuit 10 of the present invention increase the flexibility of the programmable array logic device 100.

An implementation of the input/output cell 10 of the present invention on the programmable array logic (PAL) device 100 is described. Reference numbers used in FIG. 1 will be used in FIG. 2 to identify like components.

Accordingly, the input/output logic macrocell 78 described in FIG. 1 is included in the programmable array logic device 100 for each of the input/output (I/O) pins 12 in the programmable array logic device. The input/output cell 10 of the present invention configures the input/output pins 12 as discussed above in detail with reference to FIG. 1.

The I/O pins are connected to the I/O Logic macrocell 76 via inverting buffer 62 as discussed with reference to FIG. 1. The output enable signal carried on line 64 is generated from a product term conducted from the programmable AND array on line 68. Thus the circuit including the sum of outputs from the programmable AND arrays dynamically provides an output enable signal on line 64.

As shown on FIG. 2, the logic signal on lines 14 are provided as a sum-of-product term combinatorial signal from the OR-gates 106a and 106b. In FIG. 2, a five-input OR-gate 106a receiving signals from five separate programmable AND gates 101 provides the combinatorial signal received by the input select MUX 18. However, as is appreciated in the art, any number of programmable AND gates can be designed as an input to the OR-gate 106a to provide this combinatorial signal.

In the preferred embodiment, a clock is connected to an input pin (now shown), providing a clock (CK) signal on line 107 to the programmable array in addition to the clock signal CLK on line 107a. In FIG. 2, the connection between the clock signal lines 107 and 107a, providing an input to the array, is not shown since it is not necessary to the invention.

Each of the dynamic control signals, other than the input select MUX signal and the synchronous preset signal on line 60 discussed with reference to FIG. 1, are provided as the output of a single programmable AND array. Accordingly, the asynchronous reset signal (ASYN RST) is provided as the output of a programmable AND array on line 120. The clocking product term (CPT) signal is provided as the output of a programmable AND array on line 122. The output enable select signal is provided via a five-input OR gate 106b as the output of a programmable AND array on line 68b. The output enable signal is provided as the output of a programmable AND array on lines 68. Any of the control signals mentioned above can be implemented by more complicated logic circuitry, such as sum-of-products terms, if desired.

Each of the input/output cells 10 on the programmable array logic device 100 includes the input/output logic macrocell 76. The means providing the various dynamic control signals can be configured in a variety of manners, either as a simple product term from the output of a single programmable AND array 101 or as a sum of products term from the ouput of an OR-gate 102 summing a plurality of programmable AND arrays. Further, each I/O pin can be configured uniquely.

The programmable array logic (PAL) device 100 shown in FIG. 2 is illustrated with two input/output cells 10 configuring two separate I/O pins. However, the ellipses 116, 117 indicate that any number of I/O pins and inputs can be designed into the device and any size of programmable array logic grid 110 can be formed within the constraints of integrated circuit and packaging technology.

A typical programmable array logic device may for instance include 24 external pins, a majority of which are configured as input/output pins using an input/output cell 10 such as taught by the present invention.

In FIG. 2, the asynchronous preset signal ASYN PRST is provided in common to all the register/latchs 22 (See FIG. 1)in the output logic macrocells 76 on the programmable array logic device 100. The asynchronous preset signal is dynamically provided as a product term from the output of a programmable AND array on line 60. As with the other dynamic control signals, the asynchronous preset ASYN PRST signal or asynchronous reset signal AYN RST can be implemented with other logic circuitry such as a sum-of-products term according to the present invention. The ASYN PRST signal is not shown connected to each of the output logic macrocells 76 in order to simplify the drawing.

The function of the programmable array logic device 100 is enhanced by the dynamically provided control signals in conjunction with the eleven programmable fuses 20, 23, 31, 32, 40, 47, 48, 56, 59, 69 and 70. A functional description of the fuse-programmable input-/output cell 10 of the present invention is presented in tabular form in Tables IA, IB, IC, ID and IE.

With regard to Table IA, the various fusible links 20, 23, 30, 32 and 40 of the I/O cell 10 can be set to produce the indicated function, where, in the case of fuse 20, an entry "0", respectively "1", means the fuse 20 is set so that input select MUX 18 passes the signal at the 1D input, respectively, 10 input. In the case of fuse 23, an entry "0 ", respectively "1", means the fuse 23 is set so that register/latch 22 operates as a register, respectively, latch. In the case of fuse 31 (output select fuse), an entry "0", respectively, "1", means the fuse 31 is set so that output select MUX 26 passes the signal from the OR gate 16, respectively, the register/latch 22 and in the case of fuse 32 (output polarity fuse), an entry "0", respectively, "1", means the fuse 32 is set so that output select MUX 26 passes the signal at the true, respectively, complemented, input. In the case of fuse 40, an entry "0", respectively, "1", means the fuse 40 is set so that feedback MUX 38 passes the signal from the "OR" gate 16, respectively, the register/latch 22. A similar scheme for interpreting the entries in Tables IB through IE is used. An "X" entry indicates "don't-care".

The entries in the column labelled "Input/Output" indicate the function performed by register/latch 22 (controlled by fuses 20 and 23). The entries in the column labelled "Output Polarity" indicate whether the signal generated by the output select MUX 26 is active HIGH or is active LOW (controlled by fuse 32) and fuse 31 determines the nature of ouput generated at MUX 26 as combinatorial, registered or latched. The entries in the column labelled "Feedback" indicate the nature of the signal generated by the feedback select MUX 38 (controlled by fuse 40).

TABLE IA

Functional Description of I/O Cell 10

| Fusible Link Status | | | | | Function | | |
|---|---|---|---|---|---|---|---|
| 20 | 23 | 31 | 32 | 40 | Input/Output | Output Polarity | Feedback |
| 0 | X | 0 | 0 | 0 | Comb. Out | HIGH | Comb. |
| 0 | X | 0 | 1 | 0 | Comb. Out | LOW | Comb. |
| 0 | 0 | 0 | 0 | 1 | Comb. Out | HIGH | Register |
| 0 | 0 | 0 | 1 | 1 | Comb. Out | LOW | Register |
| 0 | 1 | 0 | 0 | 1 | Comb. Out | HIGH | Latched |
| 0 | 1 | 0 | 1 | 1 | Comb. Out | LOW | Latched |
| 0 | 0 | 1 | 0 | 0 | Reg. Out | HIGH | Comb. |
| 0 | 0 | 1 | 1 | 0 | Reg. Out | LOW | Comb. |
| 0 | 0 | 1 | 0 | 1 | Reg. Out | HIGH | Reg. |
| 0 | 0 | 1 | 1 | 1 | Reg. Out | LOW | Reg. |
| 0 | 1 | 1 | 0 | 0 | Latched Out | HIGH | Comb. |
| 0 | 1 | 1 | 1 | 0 | Latched Out | LOW | Comb. |
| 0 | 1 | 1 | 0 | 1 | Latched Out | HIGH | Latched |
| 0 | 1 | 1 | 1 | 1 | Latched Out | LOW | Latched |
| 1 | 0 | X | X | 1 | Comb. Input | | Buried Reg. |
| 1 | 1 | X | X | 1 | Comb. Input | | Buried Latch |
| 1 | 0 | X | X | 1 | Comb. Input | | Registered Input |
| 1 | 1 | X | X | 1 | Comb. Input | | Latched Input |

TABLE IB

Functional Description of I/O Cell 10

| Fusible Link Status | | |
|---|---|---|
| 47 | 48 | Clocking Function |
| 0 | 0 | External on rising edge (CLK) |
| 0 | 1 | External on trailing edge (CLK) |
| 1 | 0 | Internal on rising edge (CPT) |
| 1 | 1 | Internal on trailing edge (CPT) |

TABLE IC

Functional Description of I/O Cell 10

| Fusible Link Status | | |
|---|---|---|
| 69 | 70 | Buffer 62 Function |
| 0 | 0 | Always enabled |
| 0 | 1 | Always disabled |
| 1 | 0 | Externally driven |
| 1 | 1 | Internally driven |

TABLE ID

Functional Description of I/O Cell 10

| Fusible Link Status 56 | Asynchronous Resetting of Register/Latch 22 |
|---|---|
| 0 | Trailing Edge |
| 1 | Rising Edge |

TABLE IE

Functional Description of I/O Cell 10

| Fusible Link Status 59 | Asynchronous Presetting of Register/Latch 22 |
|---|---|
| 0 | Trailing Edge |
| 1 | Rising Edge |

By way of example, a programmable, dynamically changing output enable signal on line 68a in conjunction with a blown fuse 70 can disable the output inverting buffer 62 an allow the I/O pin 12 to provide an input signal independent of the output signal provided by the output select MUX 26 in the input/output logic macrocell 76. The input signal from the I/O pin 12 is provided over line 72 to the true and complement buffer 74 as feedback to the programmable logic array grid 110. When the output enable signal on line 68 changes back dynamically, the I/O pin 12 resumes its function as an output pin.

An example of an enhancement in function available through the dynamically provided asynchronous reset signal ASYN RST on line 120 proceeds as follows. When the asynchronous reset signal ASYN RST on line 120 becomes high, the output of the register/latch 22 received by output select MUX 26 will change to LOW. Thus, the complement of the output of the register/latch 22 reeived by output select MUX 26 will go HIGH. The dynamic feedback MUX 38 select signal 50 and the dynamic output select MUX 26 signals $S_2$, $S_2$ have a predictable registered output to select, which is independent of the combinatorial logic signal generated by OR gate 16. Thus, by coordinating the programming of the programmable AND arrays providing the asynchronous reset signal ASYN RST, the feedback select signal S0 via programmable fuse 40, the output select signal $S_1$ via programmable fuse 32 and the signal which controls the output select signal $S_2$ via line 30, a particular function of the programmable array logic device 100 can be implemented which can not be done in prior art devices. Other combinations of the control signals can be conceived to provide other functions.

Another example of an enchancement in the operation of the PAL device 100 involves the ability of the user to dynamically deploy the register/latch 22 as an input, output or as a buried register. By programming of the programmable AND arrays providing the sum of product terms generated by OR gate 16, the signal applied at the 1D input terminal of Input Select MUX 18, in conjunction with the programmable fuse 20, the user can cause the output select MUX 26 to pass or not pass the signal generated at the Q output terminal of register/latch 22 to the I/O pin 12 and to cause the signal generated at the output of OUTPUT SELECT MUX 26 to be conducted back to the programmable AND array via the true and complemented buffer 74. In addition, by coordinating programming of the OE signal generated by the programmable arrays, the inverting buffer 62 can be disabled and the I/O pin 12 will function as an input pin so that a signal applied thereto will be conducted back to the programmable AND array via the true and complemented buffer 74.

Although not shown in the embodiment in FIG. 2, the asynchronous preset signal could likewise be provided dynamically to each of the input/output macrocells 76 independently providing additional flexibility in the input/output cell 10 of the present invention.

By providing the feedback multiplexer 38 which selects from a signal received from register/latch 22 and a combinatorial signal received via gate 16 independently from the signal generated by output select MUX 26, an additional feature enhancing the performance of the programmable array logic device 100 can be seen. Thus by coordinating the output enable signal on line 64 with the feedback selection via fuse 40 the inverting buffer 62 can be disabled allowing the I/O pin 12 to provide an input signal across line 72 to the true and complement buffer 74 at the same time that a logic signal, either the register or the combinatorial signal, can be fed back through the true complement buffer 41 to the programmable logic array. Thus the feedback through the true complement buffer 44 is not affected by the disabling of the output inverting buffer 62.

As the foregoing examples illustrate, the function of the programmable array logic device 100 is greatly enhanced by the output logic circuit 10 of the present invention. Further the output logic circuit 10 can be utilized in a variety of integrated circuit devices to enchance the flexibility and dynamic control of the particular circuit implemented on the integrated circuit chip. In this manner the limitation occasioned by the relatively small number of input/output ports on a given integrated circuit chip with respect to the number of logic devices implemented on the chip can be minimized.

Figure 4:
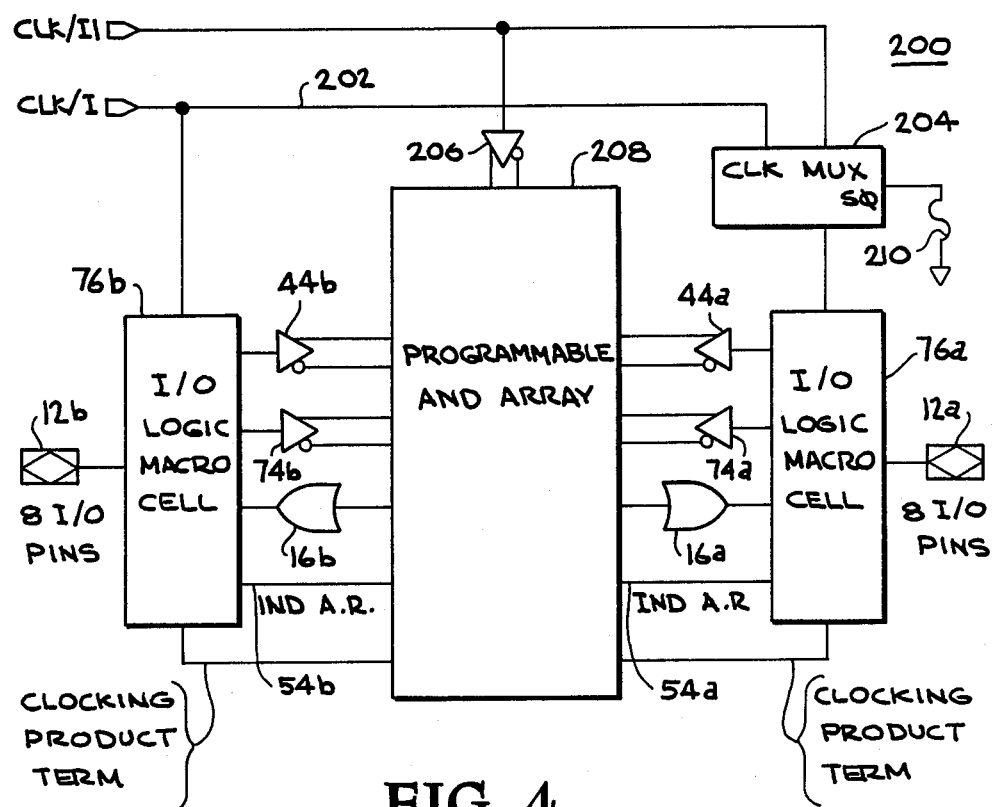
FIG. 4 is a schematic diagram of a programmable array logic device implementing the present invention employing dual clocks.

An alternative embodiment of a programmable array logic (PAL) device 200 employing the I/O logic macrocell 76 of the instant invention is shown in FIG. 4. A programmable AND array 200 is shown having a first bank of I/O logic macrocells 76a interfacing to a prepresentative one of 8 I/O pins 12a and a second bank of I/O Logic macrocell 76b interface to a respresentative one of 8 I/O pins 126. As this embodiment differs from that illustrated in FIG. 2 only in the clocking mechanism, many of the elements shown therein are omitted from FIG. 4 in the interests of clarity. The suffix "a" or "b" is used on FIG. 4 and its description when referring to elements forming a portion of a macrocell 76a or of a macrocell 76b, respectively.

A first clock signal (CLK/I) applied to the integrated circuit package containing the PAL 200 is conducted on signal line 202 to the 1D input of CLK select MUX 46b of the I/O logic macrocell 76b and to a first input terminal of a fuse-programmable clock multiplexer (CLK MUX) 204 a second clock signal (CLK/II) applied to PAL 200 is conducted to the second input terminal of CLK MUX 204 as well as to clock driver/inverter 206 which provides a clock to the programmable AND array 208. By appropriate programming of the field-programmable fuse 210 connected to a control select input (SO) of CLK MUX 204, the clock signal generated at its output is either the CLK I or CLK II signal. The clock signal generated by MUX 204 is conducted to the 1D input of CLK select MUX 46a of the I/O logic macrocell 76a. Since each macrocell permits fuse-prorammable clock polarity selection, each bank can have a separate programmable clock polarity. Furthermore, provision of fuse-programmable CLK MUX 204 allows the use of a common clock (CLK I) or different clocks CLK I and CLK II for each bank.

The foregoing description of a preferred embodiment of the invention has been presented for purposes of illustration and description. It is not intended to be exhaustive or to limit the invention to the precise form disclosed, and obviously many modifications and variations are possible in light of the above teaching. The programmable array logic device embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A programmable logic cell, responsive to a data signal generated by a portion of an integrated circuit, and a plurality of dynamic control signals, comprising:
input select multiplexer means, responsive to a programmable input select signal, receiving said data signal and a signal received via said input/output port for selectively coupling one of said received signals to an input multiplexer output in response to said input select signal;

register/latch means, receiving a programmable mode select signal, connected to the output of said input select multiplexer means and responsive to a clock/latch enable signal selectably operable in either a register or a latch mode, in response to said mode select signal, for registering or latching said signal received from said input select multiplexer and for generating therefrom at a register/latch output a registered or latched signal; and output select multiplexer means having a first true and a first complementing input and a second true and a second complementing input, responsive to a programmable output select signal, responsive to a first of said dynamic control signals, and receiving said data signal at said first true and said first complementing inputs, and said signal generated by said register/latch means at said second true and said second complementing inputs, for selectively coupling one of said received signals, or its complemented signal, to an output multiplexer output in response to said output select signal and to said first dynamic control signal.

2. A logic cell according to claim 1, further including:
clock select multiplexer means, responsive to a first programmable clock select signal, receiving a clock signal and a second of said dynamic control signals for selectively coupling one of said received signals to an output of said clock select multiplexer means in response to said first clock select signal, said signal generated at said output of said clock select multiplexer means being said clock/latch enable signal received by said register/latch means.

3. A logic cell according to claim 2, wherein said clock select multiplexer means further receives a second programmable clock select signal, said clock select multiplexer means further for selectively generating said clock/latch enable signal received by said register/latch means in a true or a reverse polarity, in response to said second clock select signal.

4. A logic cell according to claim 3 wherein said clock select multiplexer means includes a second programmable fusible link the status of which determines said second clock select signal.

5. A logic cell according to claim 3 wherein said second clock select signal is generated by a memory cell.

6. A logic cell according to claim 2, further including:
feedback multiplexer means, responsive to a programmable feedback select signal, receiving said data signal and said signal generated by said register/latch means for selectively coupling one of said received signals to a feedback multiplexer means output in response to said feedback select signal,
wherein said signal generated at said feedback multiplexer means output is conducted to said portion of said integrated circuit portion.

7. A logic cell according to claim 6 wherein said feedback multiplexer means includes a programmable fusible link the status of which determines said feedback select signal.

8. A logic cell according to claim 6 wherein said feedback select signal is generated by a memory cell.

9. A logic cell according to claim 2 wherein said clock select multiplexer means includes a first programmable fusible link the status of which determines said first clock select signal.

10. A logic cell according to claim 2 wherein said first clock select signal is generated by a memory cell.

11. A logic cell according to claim 1, wherein said integrated circuit has a port serving as an input, said logic cell further including means receiving said signal generated at said output of said output select multiplexer means for generating therefrom a signal at said port, said output means responsive to an output enable control signal and an output enable polarity control signal, said output means further selectively enabling generation of said signal at said output port or disabling generation of said signal, in response to said output enable control signal.

12. A logic cell according to claim 11 wherein said integrated circuit port also serves an an input, said output means further for receiving a signal received at said port, said logic cell further including:
output enable multiplexer selection means, responsive to a programmable output enable control signals and an output enable polarity control signal, connected to said input/output means, receiving a third and a fourth dynamic control signal for selectively generating said third or said fourth dynamic control signal received by said input/output means in a true or a reverse polarity, in response to said output enable and said output polarity control signals.

13. A logic cell according to claim 12, further including:
means responsive to said signal generated by said input/output means for generating signals to said portion of said integrated circuit portion.

14. A logic cell according to claim 12 wherein said output enable and said output enable polarity signals are generated by a memory cell.

15. A logic cell according to claim 12 wherein said output enable multiplexer selection means includes a first and a second programmable fusible link the status of which determines said output enable and said output enable polarity signals, respectively.

16. A logic cell according to claim 12, wherein said register/latch means if further responsive to a fifth of said dynamic control signals for asynchronous resetting of said registered or latched signal generated thereby to a predetermined level, in response to said fifth dynamic control signal, said logic cell further including:
asynchronous reset polarity selection means, responsive to a programmable asynchronous reset polarity selection signal, connected to said register/latch means, receiving said fifth dynamic control signal for selectively generating said fifth dynamic control signal received by said input/output means in a true or a reverse polarity, in response to said asynchronous reset polarity control signal.

17. A logic cell according to claim 16 wherein said asynchronous reset polarity selection means is an exclusive OR gate receiving at a first input terminal said fifth dynamic control signal and at a second input terminal said asynchronous reset polarity control signal.

18. A logic cell according to claim 16 wherein said asynchronous reset polarity selection means includes a programmable fusible link the status of which determines said asynchronous reset polarity control signal.

19. A logic cell according to claim 16 wherein said asynchronous reset polarity control signal is generated by a memory cell.

20. A logic cell according to claim 16, wherein said register/latch means is further responsive to a sixth of said dynamic control signals for asynchronous presetting of said registered or latched signal generated thereby to a predetermined level, in response to said sixth dynamic control signal, said logic cell further including:

asynchronous preset polarity selection means, responsive to a programmable asynchronous preset polarity selection signal, connected to said register/latch means, receiving said sixth dynamic control signal for selectively generating said sixth dynamic control signal received by said input/output means in a true or a reverse polarity, in response to said asynchronous polarity control signal.

21. A logic cell according to claim 20 wherein said asynchronous preset polarity selection means is an exclusive OR gate receiving at a first input terminal said sixth dynamic control signal and at a second input terminal said asynchronous preset polarity control signal.

22. A logic cell according to claim 20 wherein said asynchronous preset polarity selection means includes a programmable fusible link the status of which determines said asynchronous preset polarity control signal.

23. A logic cell according to claim 20 wherein said asynchronous preset polarity control signal is generated by a memory cell.

24. A logic cell according to claim 1 further including input multiplexer preload means responsive to a seventh and an eighth dynamic control signal for generating said input select control signal received by said input select multiplexer.

25. A logic cell according to claim 24 wherein said input multiplexer preload means includes a programmable fusible link and an OR gate receiving said seventh and eighth dynamic control signals at a first and a second input terminal, respectively, and connected to said programmable fusible link at a third input terminal, for generating said input select signal, and wherein said seventh dynamic control signal is received from an external pin, and said eighth dynamic control signal is received from said portion of said integrated circuit.

26. A logic cell according to claim 1 where the source of predetermined ones of said dynamic control signals is selectable from an external pin, or from said portion, of said integrated circuit.

27. A logic cell according to claim 1 wherein said output select multiplexer means includes a programmable fusible link the status of which determines said input select signal.

28. A logic cell according to claim 1 wherein said output select multiplexer includes a first and a second programmable fusible link the status of which determines said output select signal.

29. A logic cell according to claim 1 wherein said input select control signal is generated by a memory cell.

30. A logic cell according to claim 1 wherein said output select control signal is generated by a memory cell.

31. A logic cell according to claim 1 wherein said mode select signal is generated by a memory cell.

32. In a programmable array logic device contained on an integrated circuit chip having a portion comprising a plurality of logic cell means dynamically generating logic signals, and a second plurality of combinatorial logic means for combining a subset of logic signals to generate a plurality of combinatorial signals therefrom, a programmable input/output cell, responsive to a data signal, being a predetermined one of said combinatorial signals, and a plurality of dynamic control signals, selectable from signals applied to an external pin of said integrated circuit chip and predetermined ones of said plurality of combinatorial signals generated by said portion of said integrated circuit, for configuring an input/output port of said integrated circuit, comprising:

input select multiplexer means, responsive to a programmable input select signal, receiving said data signal and a signal received via said input/output port for selectively coupling one of said received signals to an input muliplexer output in response to said input select signal;

register/latch means, responsive to a programmable mode select signal, connected to the output of said input select multiplexer means and responsive to a clock/latch enable signal selectably operable in either a register or a latch mode, in response to said mode select signal, for registering or latching said signal received from said input select multiplexer and for generating therefrom at a register/latch output a registered or latched signal;

output select multiplexer means, having a first true and a first complementing input and a second true and a second complementing input responsive to a programmable output select signal, responsive to a first of said dynamic control signals, and receiving said data signal at said first true and said first complementing inputs, and said signal generated by said register/latch means at said second true and said second complementing inputs, for selectively coupling one of said received signals, or its complemented signal, to an output multiplexer output in response to said output select signal and to said first dynamic control signal; and input/output means receiving said signal generated at said output of said output select multiplexer means for generating therefrom a signal at said integrated circuit input/output port, said input/output means also for receiving a signal received at said input/output port.

33. A programmable array logic device according to claim 32, said input/output cell further including:

clock select multiplexer means, responsive to a first programmable clock select signal, receiving a clock signal and a second of said dynamic control signals for selectively coupling one of said received signals to an output of said clock select multiplexer means in response to said first clock select signal, said signal generated at said output of said clock select multiplexer means being said clock/latch enable signal received by said register/latch means.

34. A programmable array logic device according to claim 33 wherein said clock select multiplexer means includes a first programmable fusible link the status of which determines said first clock select signal.

35. A programmable array logic device according to claim 33 wherein said first clock select signal is generated by a memory cell.

36. A programmable array logic device according to claim 33, wherein said clock select multiplexer means further receives a second programmable clock select signal, said clock select multiplexer means further for selectively generating said clock/latch enable signal received by said register/latch means in a true or a reverse polarity, in response to said second clock select signal.

37. A programmable array logic device according to claim 36 wherein said clock select multiplexer means includes a second programmable fusible link the status of which determines said second clock select signal.

38. A programmable array logic device according to claim 36 wherein said second clock select signal is generated by a memory cell.

39. A programmable array logic device according to claim 33, said input/output cell further including:
feedback multiplexer means, responsive to a programmable feedback select signal, receiving said data signal and said signal generated by said register/latch means for selectively coupling one of said received signals to a feedback multiplexer means output in response to said feedback select signal,
wherein said signal generated at said feedback multiplexer means output is conducted to said portion of said integrated circuit.

40. A programmable array logic device according to claim 39 wherein said feedback multiplexer means includes a programmable fusible link the status of which determines said feedback select signal.

41. A programmable array logic device according to claim 32, said input/output cell wherein said input/output means is responsive to an output enable control signal and an output enable polarity control signal, said input/output means further selectively enabling generation of said signal at said input/output port or disabling generation of said signal, in response to said output enable control signal, said input/output cell further including:
output enable multiplexer selection means, responsive to a programmable output enable control signal and an output enable polarity control signal, connected to said input/output means, receiving a third and a fourth dynamic control signals for selectively generating said third or said fourth dynamic control signal received by said input/output means in a true or a reverse polarity, in response to said output enable and said output polarity control signals.

42. A programmable array logic device according to claim 41 wherein said output enable multiplexer selection means includes a first and a second programmable fusible link the status of which determines said output enable and said output enable polarity signals, respectively.

43. A programmable array logic device according to claim 41 wherein said feedback select signal is generated by a memory cell.

44. A programmable array logic device according to claim 32, said input/output cell wherein said register/latch means is further responsive to a fifth of said dynamic control signals for asynchronous resetting of said registered or latched signal generated thereby to a predetermined level, in response to said fifth dynamic control signal, said input/output cell further including:
asynchronous reset polarity selection means, responsive to a programmable asynchronous reset polarity selection signal, connected to said register/latch means, receiving said fifth dynamic control signal for selectively generating said fifth dynamic control signal received by said input/output means in a true or a reverse polarity, in response to said asynchronous reset polarity control signal.

45. A programmable array logic device according to claim 44, said input/output cell further including:
means responsive to said signal generated by said input/output means for generating signals to said portion of said integrated circuit portion.

46. A programmable array logic device according to claim 45 wherein said asynchronous preset polarity control signal is generated by a memory cell.

47. A programmable array logic device according to claim 44 wherein said asynchronous reset polarity selection means is an exclusive OR gate receiving at a first input terminal said fifth dynamic control signal and at a second input terminal said asynchronous reset polarity control signal.

48. A programmable array logic device according to claim 44 wherein said asynchronous reset polarity selection means includes a programmable fusible link the status of which determines said asynchronous reset polarity control signal.

49. A programmable array logic device according to claim 44 wherein said output enable and said output enable polarity signals are generated by a memory cell.

50. A programmable array logic device according to claim 32, wherein said register/latch means is further responsive to a sixth of said dynamic control signals for asynchronous presetting of said registered or latched signal generated thereby to a predetermined level, in response to said sixth dynamic control signal, said input/output cell further including:
asynchronous preset polarity selection means, responsive to a programmable asynchronous preset polarity selection signal, connected to said register/latch means, receiving said sixth dynamic control signal for selectively generating said sixth dynamic control signal received by said input/output means in a true or a reverse polarity, in response to said asynchronous polarity control signal.

51. A programmable array logic device according to claim 50 wherein said asynchronous preset polarity selection means is an exclusive OR gate receiving at a first input terminal said sixth dynamic control signal and at a second input terminal said asynchronous preset polarity control signal.

52. A programmable array logic device according to claim 50 wherein said asynchronous preset polarity selection means includes a programmable fusible link the status of which determines said asynchronous preset polarity control signal.

53. A programmable array logic device according to claim 50 wherein said asynchronous reset polarity control signal is generated by a memory cell.

54. A programmable array logic device according to claim 32, said input/output cell further including input multiplexer preload means responsive to a seventh and an eighth dynamic control signal for generating said input select control signal received by said input select multiplexer.

55. A programmable array logic device according to claim 32 where the source of predetermined ones of said dynamic control signals is selectable from an external pin, or from said portion, of said integrated circuit.

56. A programmable array logic device according to claim 32 wherein said input select multiplexer means includes a programmable fusible link the status of which determines said input select signal.

57. A programmable array logic device according to claim 32 wherein said output select multiplexer includes a first and a second programmable fusible link the status of which determines said output select signal.

58. A programmable array logic device according to claim 32 wherein said input select control signal is generated by a memory cell.

59. A programmable array logic device according to claim 32 wherein said output select control signal is generated by a memory cell.

60. A programmable array logic device according to claim 32 wherein said mode select signal is generated by a memory cell.

61. In a programmable array logic device contained on an integrated circuit chip having a portion comprising a plurality of logic cell means dynamically generating logic signals, and a second plurality of combinatorial logic means for combining a subset of logic signals and for generating a plurality of combinatorial signals therefrom, a first and a second plurality of programmable logic cells, each cell of said first and said second plurality responsive to a first and a second, timing signal, respectively, a data signal, being a predetermined one of said combinatorial signals, and a plurality of dynamic control signals, selectable from signals applied to an external pin of said integrated circuit chip and predetermined ones of said plurality of combinatorial signals generated by said portion of said integrated circuit for generating a first and a second plurality of signals, respectively, conducted to a first and a second plurality, respectively, of ports of said integrated circuit.

62. A programmable array logic device according to claim 61 wherein said device receives a first and a second bank clock signal, said first plurality of logic cells receiving said first bank clock signal as its timing signal, said device further including:
bank clock select multiplexer means, responsive to a programmable clock select signal and receiving said first and said second bank clock signals for selectively coupling one of said received signals to an output of said bank clock select multiplexer means in response to said clock select signal, said signal generated at said bank clock select multiplexer means output being said timing signal received by said second plurality of logic cells.

63. A programmable array logic device according to claim 62 wherein said clock select signal is generated by a memory cell.

64. A programmable array logic device according to claim 62 wherein said bank clock select multiplexer means includes a programmable fusible link the status of which determines said clock select signal.

65. A programmable array logic device according to claim 74 wherein said clock select signal is generated by a memory cell.

66. A programmable array logic device according to claim 65 wherein said bank clock select multiplexer means includes a programmable fusible link the status of which determines said clock select signal.

67. A programmable array logic device according to claim 61 wherein said logic cell means is responsive to a clock/latch enable signal and whereon said timing signal is said clock/latch enable signal.

68. A programmable logic device, responsive to a data signal generated by a portion of an integrated circuit, and a plurality of dynamic control signals, comprising:
register/latch means receiving a programmable mode control signal and receiving said data signal and responsive to a clock/latch enable signal selectively operable in either a register or latch mode, in response to said mode select signal for registering or latching said data signal and for generating at a register/latch output a registered or latched signal; and
clock select multiplexer means responsive to a first programmable clock select signal, and receiving a clock signal and a first of said dynamic control signals for selectively coupling one of said received signals to an output of said clock select multiplexer means in response to said first clock select signal, said signal generated at said output of said clock select multiplexer means being said clock/latch enable signal received by said register/latch means.

69. A programmable logic device according to claim 64, wherein said clock select multiplexer means further receives a second programmable clock select signal, said clock select multiplexer means further for selectively generating said clock/latch enable signal received by said register/latch means in a true or a reverse polarity in response to said second clock select signal.

70. A programmable logic device according to claim 69 wherein said clock select multiplexer means includes a second programmable fusible link the status of which determines said second clock select signal.

71. A programmable logic device according to claim 69 wherein said second clock select signal is generated by a memory cell.

72. A programmable logic device according to claim 64 wherein said clock select multiplexer means includes a first programmable fusible link the status of which determines said first clock select signal.

73. A programmable logic device according to claim 64 wherein said first clock select signal is generated by a memory cell.

74. In a programmable array logic device contained on an integrated circuit chip, said device receiving a first and a second bank clock signal, said device including at least a first and a second plurality of logic circuits responsive to a first and a second clock signal, respectively, said first clock signal being said first bank clock signal, said device including:
bank clock select multiplexer means, responsive to a programmable clock select signal and receiving said first and said second bank clock signals for selectively coupling one of said received signals to an output of said bank clock select multiplexer means in response to said clock select signal, said signal generated at said bank clock select multiplexer means output being said second clock signal.

* * * * *

UNITED STATES PATENT AND TRADEMARK OFFICE
CERTIFICATE OF CORRECTION

PATENT NO. : 4,771,285
DATED : September 13, 1988
INVENTOR(S) : Om Agrawal, et al.

It is certified that error appears in the above-identified patent and that said Letters Patent is hereby corrected as shown below:

Column 15, line 48 delete outline and insert --input--.

Signed and Sealed this

Second Day of August, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 4,771,285  
DATED : September 13, 1988  
INVENTOR(S) : Om Agrawal, Kapil Shankar, Fares N. Mubarak Page 1 of 2

It is certified that error appears in the above-indentified patent and that said Letters Patent is hereby corrected as shown below:

```
Column 19, Line 53: change 65 to --73--
Column 19, Line 54: change 74 to --72--
Column 19, Line 56: change 66 to --74--
Column 19, Line 57: change 65 to --72--
Column 19, Line 60: change 67 to --65--
Column 20, Line 3:  change 68 to --66--
Column 20, Line 24: change 69 to --67--
Column 20, Line 25: change 64 to --66--
Column 20, Line 32: change 70 to --68--
Column 20, Line 33: change 69 to --67--
Column 20, Line 36: change 71 to --69--
Column 20, Line 37: change 69 to --67--
Column 20, Line 39: change 72 to --70--
Column 20, Line 40: change 64 to --66--
```

UNITED STATES PATENT AND TRADEMARK OFFICE
CERTIFICATE OF CORRECTION

PATENT NO. : 4,771,285
DATED : September 13, 1988
INVENTOR(S) : Om Agrawal, Kapil Shankar, Fares N. Mubarak It is certified that error appears in the above-indentified patent and that said Letters Patent is hereby corrected as shown below:

Column 20, Line 43: change 73 to --71--
Column 20, Line 44: change 64 to --66--
Column 20, Line 46: change 74 to --72--

Signed and Sealed this

Twentieth Day of August, 1996

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 4,771,285
DATED : September 13, 1988
INVENTOR(S) : Om Agrawal, Kapil Shankar, Pares N. Mubarak It is certified that error appears in the above-indentified patent and that said Letters Patent is hereby corrected as shown below:

```
Column 19, Line 53: change 65 to --73--
Column 19, Line 54: change 74 to --72--
Column 19, Line 56: change 66 to --74--
Column 19, Line 57: change 65 to --72--
Column 19, Line 60: change 67 to --65--
Column 20, Line  3: change 68 to --66--
Column 20, Line 24: change 69 to --67--
Column 20, Line 25: change 64 to --66--
Column 20, Line 32: change 70 to --68--
Column 20, Line 33: change 69 to --67--
Column 20, Line 36: change 71 to --69--
Column 20, Line 37: change 69 to --67--
```

UNITED STATES PATENT AND TRADEMARK OFFICE
CERTIFICATE OF CORRECTION

PATENT NO. : 4,771,285
DATED : September 13, 1988
INVENTOR(S) : Om Agrawal, Kapil Shankar, Pares N. Mubarak It is certified that error appears in the above-indentified patent and that said Letters Patent is hereby corrected as shown below:

```
Column 20, Line 39: change 72 to --70--
Column 20, Line 40: change 64 to --66--
Column 20, Line 43: change 73 to --71--
Column 20, Line 44: change 64 to --66--
Column 20, Line 46: change 74 to --72--
```

Signed and Sealed this

Twenty-second Day of April, 1997

BRUCE LEHMAN

*Commissioner of Patents and Trademarks*

*Attest:*

*Attesting Officer*